United States Patent [19]

Woodhouse et al.

[11] 4,336,497
[45] Jun. 22, 1982

[54] ACCELERATION SENSOR

[75] Inventors: Richard G. Woodhouse; Peter H. Salway, both of Birmingham, England

[73] Assignee: Lucas Industries Limited, Birmingham, England

[21] Appl. No.: 125,111

[22] Filed: Feb. 27, 1980

[30] Foreign Application Priority Data

Mar. 14, 1979 [GB] United Kingdom ............... 7908985

[51] Int. Cl.³ .......................... G01P 3/42; G01P 15/00
[52] U.S. Cl. ...................................... 324/162; 73/518; 340/669
[58] Field of Search ................. 324/162; 340/669; 307/121; 73/495, 499, 514, 518

[56] References Cited

U.S. PATENT DOCUMENTS 4,070,562 1/1978 Kuno et al. .................... 340/669 X

FOREIGN PATENT DOCUMENTS 1235051 2/1967 Fed. Rep. of Germany ...... 324/162

Primary Examiner—Stanley T. Krawczewicz
Attorney, Agent, or Firm—Ferguson, Baker, Whitham, Spooner & Kroboth

[57] ABSTRACT

A device and method for measuring the rate of change of a pulse train from a transducer includes first counter which counts the number of pulses in a first fixed frequency of pulse train during each interval between the signal pulses. A divider receives the count generated in the preceding interval and divides the frequency $f_1$ of a second fixed frequency pulse train by this count. This divided pulse train is counted by a second counter for the duration of each interval to provide a ratio of the change in duration to the preceding interval's duration.

8 Claims, 2 Drawing Figures divided pulse train and counting the number of pulses in said divided pulse train in each timing interval to generate a second count related to the ratio of the change in the duration of the time interval to the duration of the immediately preceding interval.
ACCELERATION SENSOR

BACKGROUND OF THE INVENTION

The present invention relates to the measurement of the rate of change of the frequency of a pulse train and has particularly, but not exclusive, application to the measurement of the acceleration of a rotating body.

Various devices have been proposed for measuring the acceleration of a rotating body using analogue circuitry but these devices suffer from the disadvantages inherent in such circuitry.

SUMMARY OF THE INVENTION

In its broadest aspect, the present invention resides in a method of measuring the rate of change of frequency of a signal pulse train comprising counting the number of pulses in a first fixed frequency pulse train occurring during each timing interval between successive pulses of the signal pulse train to derive a first count in each timing interval dividing the frequency of a second fixed frequency pulse train by said first count for the immediately preceding interval to generate a divided pulse train and counting the number of pulses in said divided pulse train in each timing interval to generate a second count related to the ratio of the change in the duration of the time interval to the duration of the immediately preceding interval.

The invention also resides in apparatus for measuring the rate of change of frequency of a signal pulse train comprising means for counting and storing the number of pulses in a first fixed frequency pulse train occurring during each timing interval between successive pulses of the signal pulses train to derive a first count in each timing interval, means for dividing the frequency of a second fixed frequency pulse train by the value of said first count for the immediately preceding timing interval to generate a divided pulse train and means for counting the number of pulses in said divided pulse train during each timing interval to generate a second count related to the ratio of the change in the duration of the timing interval to the duration of the immediately preceding timing interval.

More specifically, according to the present invention there is provided a device for measuring the acceleration of a rotating body comprising a transducer for generating a train of pulses, the pulses being produced at equiangularly spaced positions of the rotating body, and each period between two successive pulses representing a timing interval, a first oscillator for producing pulses at a first fixed frequency $f_0$, a first counting means for counting the number of pulses produced by the first oscillator in each timing interval, a second oscillator for producing pulses at a second fixed frequency $f_1$, a divider for dividing the output of the second oscillator by the count of the first counting means in the immediately preceding timing interval, and a second counting means for counting the number of pulses produced by the divider during each timing interval.

In one arrangement, the second counting means comprises an m-bit binary up-counter and a latch responsive to the up-counter, the up-counter being set to a value $2^m - f_1/f_0$ at the beginning of each timing interval and the count in the up-counter at the end of each timing interval being stored in the latch.

In this arrangement, the device may further include a means for distinguishing between positive and negative acceleration and a logic means responsive to the latch and to the distinguishing means, in the event of a positive acceleration the logic means performing a complimenting operation on the output of the latch and adding the number 1 to the result.

In an alternative arrangement, the second counting means comprises a binary down-counter and a latch responsive to the down-counter, the down-counter being set to a value $f_1/f_0$ at the beginning of each timing interval and the count in the down-counter at the end of each timing interval being stored in the latch.

In this arrangement, the device may further include a means for distinguishing between positive and negative acceleration and a logic means responsive to the latch and to the distinguishing means, in the event of a negative acceleration the logic means performing a complimenting operation on the output of the latch and adding the number 1 to the result.

In either arrangement, the first counting means may comprise a first counter and a second counter, the number of pulses produced by the first oscillator in each timing interval being counted alternately by the first and second counters, and a data selector, during each timing interval the data selector supplying the divider with the number counted by the respective one of the first and second counters during the immediately preceding timing interval.

BRIEF DESCRIPTION OF THE DRAWINGS

The present invention will now be described in more detail, by way of example, with reference to the accompanying drawings in which.

DETAILED DESCRIPTION OF PREFERRED EMBODIMENTS

Figure 1:
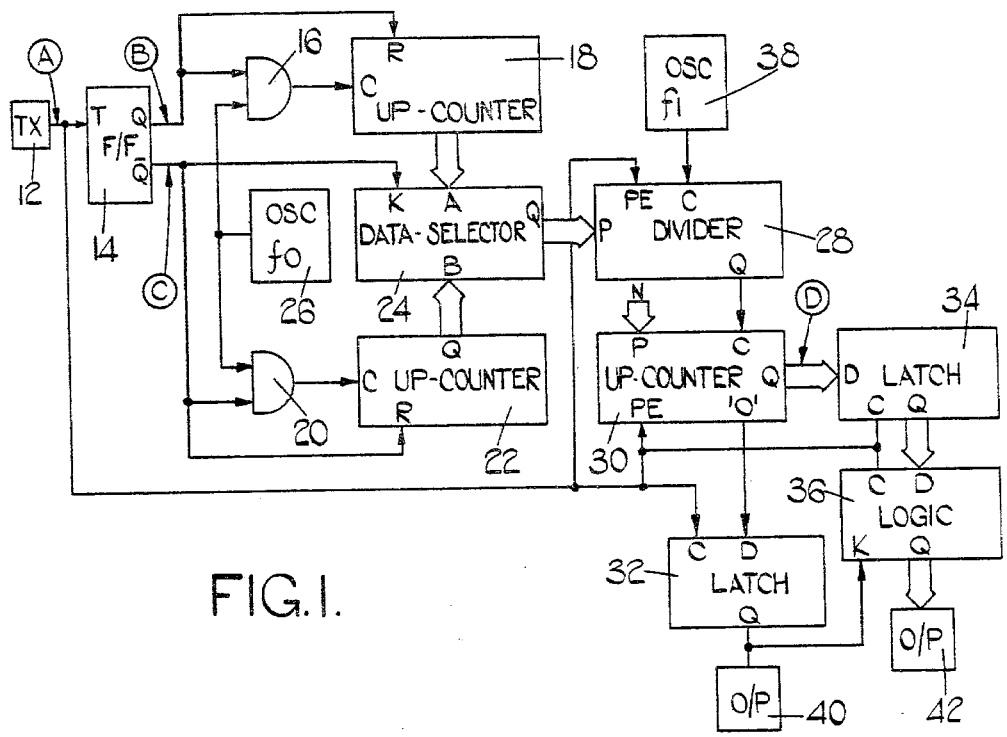
FIG. 1 is a block diagram of a device for measuring acceleration embodying the present invention.

Referring now to the Figures, there is shown a device for measuring the acceleration of a rotating body, which in the present example is an engine crankshaft. The device comprises a transducer 12 which produces pulses, as shown by waveforms A, at equiangularly spaced rotational positions of the crankshaft, for example at every half revolution. The transducer 12 may be, for example, a magnetic or optical transducer. The period between each pair of pulses represents one timing interval of the device and these timing intervals are shown as $t_0$, $t_1$, $t_2$.. in FIG. 2. These pulses are supplied to the T-input of a T flip-flop 14, which changes state at each pulse, the waveform appearing at the Q and $\overline{Q}$ outputs being shown respectively at B and C in FIG. 2.

The Q-output of the flip-flop 14 is connected to one input of an AND-gate 16 and to the RESET input R of a binary up-counter 18; and the $\overline{Q}$-output is connected to one input of an AND-gate 20, to the RESET input R of a binary up-counter 22, and to the CONTROL input K of a data selector 24. Each of the counters 18 and 22 is arranged so that it is reset when a positive going pulse is applied to the RESET input. The data-selector 24 has two multi-bit DATA inputs, namely input A and input B, and a single multi-bit DATA output Q. The data-selector 24 is arranged so that when the signal at the CONTROL input K is high the data at input A is transmitted to the output Q and when it is low the data at input B is transmitted to the output Q.

The device further includes an oscillator 26 which supplies pulses at a fixed frequency $f_0$ to the other inputs of AND-gates 16 and 20, the output of AND-gate 16 being connected to the CLOCK input C of counter 18 and the output of AND-gate 20 being connected to the CLOCK input C of counter 22. Thus, counters 18 and 22 count the pulses produced by oscillator 26 in alternate timing intervals.

The flip-flop 14, AND-gates 16 and 20, the counters 18 and 22, and the data-selector 24 comprises a first counting means.

The pulses from the transducer 12 are also supplied to the PRESET ENABLE input PE of a programmable divider 28, to the PRESET ENABLE input PE of an m-bit binary up-counter 30, to the CLOCK input C of a latch 32, to the CLOCK input C of a latch 34, and to the CLOCK input C of a logic circuit 36. The device 10 further includes an oscillator 38 which produces pulses at a fixed frequency $f_1$. The output pulses of the oscillator 38 are supplied to the CLOCK input C of divider 28 and the multi-bit output Q of the data-selector 24 is connected to the multi-bit PRESET input P of divider 28. The divider 28 is arranged so that on receiving a pulse at its PRESET ENABLE input PE it divides the pulses appearing at its CLOCK input C by the number appearing at the PRESET input P, the resulting pulses appearing at its output Q.

The output Q of divider 28 is connected to the CLOCK input C of counter 30 and a binary number N is supplied to the PRESET input P of counter 30. For a reason which will be explained below, the number N is equal to $2^m - f_1/f_0$. The counter 30 on receiving a pulse at its PRESET ENABLE input PE counts upwardly from the number N, the resulting count appearing at its multi-bit output Q. This count is shown by waveform D in FIG. 2. Also, if the counter 30 exceeds its maximum count, namely $2^m - 1$, a high signal appears at its ZERO output '0'. The ZERO output '0' of the counter 30 is connected to the DATA input D of latch 32, the output Q of which is connected to an output device 40 and to the CONTROL input K of logic circuit 36.

The multi-bit output Q of counter 30 is connected to the multi-bit DATA input D of latch 34, the multi-bit output Q of which is connected to the multi-bit DATA input D of the logic circuit 36. The logic circuit 36 is arranged so that, in the presence of a high signal at its CONTROL input K, it transmits the number appearing at its DATA input D to its output Q, and in the presence of a low signal, it performs a binary complimenting operation on the number appearing at its DATA input Q to produce a new number and adds the number 1 to this new number, the resulting number appearing at its multi-bit output Q. The output Q of circuit 36 is connected to a suitable numerical display device 42.

The counter 30 and latch 34 comprises a second counting means. The operation of the device 10 will now be described.

During the timing interval $t_1$, the AND-gate 16 will be enabled and the counter 18 will count the pulses from the oscillator 26, the total number $n_A$ of pulses counted being given by $$n_A = f_0 t_1$$

Also, during the timing interval $t_1$, the number of pulses $n_B$ counted by counter 22 during the interval $t_0$ will be supplied by the data-selector 24 to the divider 28. Since $$n_B = f_0 t_0$$

the frequency $f_x$ of the pulses appearing at the output Q of the divider 28 will be given by $$f_x = f_1/f_0 t_0$$

During the timing interval $t_2$, the AND-gate 20 will be enabled and the counter 22 will count the pulses from the oscillator, the total number of pulses $n_B$ counted being given by $$n_B = f_0 t_2$$

Also, during the timing interval $t_2$, the frequency of the pulses appearing at the output Q of divider 28 will be given by $$f_x = f_1/f_0 t_1$$

During the interval, $t_1$, the number of pulses counted by the counter 30 will be given by $$f_x t_1 = f_1 t_1/f_0 t_0$$

and during the interval $t_2$, the number will be given by $$f_x t_2 = f_1 t_2/f_0 t_1$$

In general, during a timing interval $t_n$, the number of pulses counted by the counter 30 will be given by $$f_x t_n = \frac{f_1}{f_0} \cdot \frac{t_n}{t_{n-1}}$$

Thus, if the period between pulses supplied by the transducer 12 remains constant, corresponding to zero acceleration, the number of pulses counted by counter 30 will be $f_1/f_0$. As explained above, the counter 30 is preset to a count of $2^m - f_1/f_0$, and so with zero acceleration, the number appearing at the output Q of counter 34 will be exactly zero at the end of each timing interval, thereby providing an indication of zero acceleration.

If the period between pulses supplied by the transducer 12 increases, corresponding to negative acceleration or deceleration, the number appearing at the output Q of the counter 30 at the end of a timing interval $t_n$ will be given by $$\frac{f_1}{f_0} \cdot \frac{t_n}{t_{n-1}} - \frac{f_1}{f_0} = \frac{f_1}{f_0} \cdot \left( \frac{t_n - t_{n-1}}{t_{n-1}} \right)$$

Thus, the number appearing at the output Q will be a small number which is directly proportional to the ratio of the change of the angular speed to the angular speed of the crankshaft between the interval $t_{n-1}$ and the interval $t_n$.

At the end of the timing interval $t_n$, this number will be stored in the latch 34. As, at the end of the interval $t_n$, the ZERO output '0' of the counter 30 will be high, during the interval $t_{n+1}$, the latch 34 will supply a high signal to the CONTROL input K of the logic circuit 36. Consequently, the number stored in latch 34 will directly supplied to the display device 42 and thereby provide an indication of the magnitude of the ratio of the change of speed to the angular speed. Also, as the output of the latch 32 is high, the display device 40 will provide an indication that there is negative acceleration or deceleration.

If the period between pulses supplied by the transducer 12 decreases, corresponding to positive acceleration, the number appearing at the output Q of the counter 30 at the end of a timing interval $t_n$ will be a high number having a value $$2^m - \frac{f_1}{f_0} \cdot \left(1 - \frac{t_n}{t_{n-1}}\right)$$

At the end of interval $t_n$, this number will be stored in latch 34. As the counter 30 will not now recycle during the interval $t_n$, the signal appearing at its ZERO output '0' at the end of the interval $t_n$ will be low and, consequently, during the interval $t_{n+1}$, the latch 32 will supply a low signal to the CONTROL input K of logic circuit 36. Logic circuit 36 will perform a complimenting operation on the number stored in latch 34 to provide a new number, add the number 1 to this new number, and supply the resulting number to its output Q. This resulting number will have a value $$\frac{f_1}{f_0}\left(\frac{t_{n-1} - t_n}{t_{n-1}}\right)$$

Thus, the number appearing at the output Q of the logic circuit 36 and displayed by the device 42 will be directly proportional to the ratio of the change of speed to the angular speed of the crankshaft. Also, as the output of the latch 32 is low, the device 40 will provide an indication that the acceleration is positive.

Figure 2:
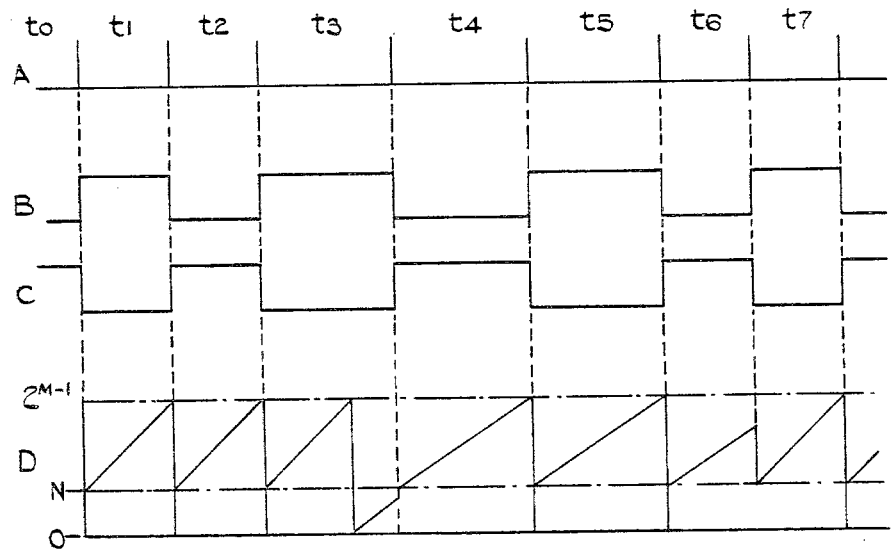
FIG. 2 shows waveforms appearing at various points in the device of FIG. 1.

Referring to FIG. 2, an example of deceleration is shown in timing intervals $t_2$ and $t_3$ and an example of acceleration is shown in timing intervals $t_5$ and $t_6$.

In an alternative embodiment of the present invention, not shown, the up-counter 30 is replaced by a down-counter. In this embodiment, the down-counter is set to a value $f_1/f_0$ at the beginning of each timing interval and the logic circuit is arranged to perform the complimenting operation in the case of negative acceleration or deceleration.

The device 10 may be used to provide an indication of engine roughness, fluctuations in the acceleration corresponding to rough running of the engine. Also, the device 10 may be used to provide an input signal to an engine control system. In this case, the devices 40 and 42 are not used and the outputs Q of the latch 32 and logic circuit 42 are connected directly to inputs of the control system.

Although the device described above makes use of separate counters, gates, latches etc, it will be clearly understood that the functions of these elements can be carried out by means of a microprocessor provided with suitable program data.

We claim:
1. A method of measuring the rate of change of frequency of a signal pulse train comprising: counting the number of pulses in a first fixed frequency pulse train occurring during each timing interval between successive pulses of the signal pulse train to derive a first count in each timing interval; dividing the frequency of a second fixed frequency pulse train by said first count for the immediately preceding interval to generate a divided pulse train; and counting the number of pulses in said divided pulse train in each timing interval to generate a second count related to the ratio of the change in the duration of the time interval to the duration of the immediately preceding interval.

2. Apparatus for measuring the rate of change of frequency of a signal pulse train comprising:
means for counting and storing the number of pulses in a first fixed frequency pulse train occurring during each timing interval between successive pulses of the signal pulse train and for deriving a first count in each timing interval;
means for dividing the frequency of a second fixed frequency pulse train by the value of said first count for the immediately preceding timing interval and for generating a divided pulse train; and
means for counting the number of pulses in said divided pulse train during each timing interval and for generating a second count related to the ratio of the change in the duration of the timing interval to the duration of the immediately preceding timing interval.

3. A device for measuring the acceleration of a rotating body comprising:
a transducer means for generating a train of pulses, the pulses being produced at equiangularly spaced positions of the rotating body, and each period between two successive pulses representing a timing interval;
a first oscillator means for producing pulses at a first fixed frequency $f_0$;
a first counting means for counting the number of pulses produced by the first oscillator in each timing interval;
a second oscillator means for producing pulses at a second fixed frequency $f_1$;
a divider means for dividing the output of the second oscillator by the count of the first counting means in the immediately preceding timing interval; and
a second counting means for counting the number of pulses produced by the divider during each timing interval, said second counter output is proportional to the ratio of change in duration of a timing interval to the duration of the immediately preceding time interval.

4. A device as claimed in claim 3 in which said first counting means comprises a first counter and a second counter, the number of pulses produced by the first oscillator in each timing interval being counted alternately by the first and second counters, and a data selector means, during each timing interval for supplying the divider with the number counted by the respective one of the first and second counters during the immediately preceding timing interval.

5. A device as claimed in claim 3 or claim 4 in which the second counting means comprises:
an m-bit binary up-counter; and
a latch, responsive to the up-counter, the up-counter being set to a value $2^m - f_1/f_0$ at the beginning of each timing interval and the count in the up-counter at the end of each timing interval being stored in the latch where m is an integer and $2^m - 1$ is the maximum count of said up-counter.

6. A device as claimed in claim 5 further including:
means for distinguishing between positive and negative acceleration; and a logic means, responsive to the latch and to the distinguishing means, for performing, during positive acceleration, a complimenting operation on the output of the latch and adding the number 1 to the result of the complimenting operation.

7. A device as claimed in claim 3 or claim 4 in which the second counting means comprises a binary down-counter and a latch responsive to the down-counter, the down-counter being set to a value $f_1/f_0$ at the beginning of each timing interval and the count in the down-counter at the end of each timing interval being stored in the latch.

8. A device as claimed in claim 7 further comprising: means for distinguishing between positive and negative acceleration; and a logic means, responsive to the latch and to the distinguishing means, for performing, during negative acceleration, a complimenting operation on the output of the latch and adding the number 1 to the result of the complimenting operation.

* * * * *